(12) United States Patent
Zhao et al.

(10) Patent No.: US 7,566,908 B2
(45) Date of Patent: Jul. 28, 2009

(54) GAN-BASED AND ZNO-BASED LED

(76) Inventors: Yongsheng Zhao, 910 Columbia St., Brea, CA (US) 92821; Jin-Joo Song, 910 Columbia St., Brea, CA (US) 92821; Chan Kyung Choi, 250 W. Central Ave., No. 508, Brea, CA (US) 92821

( * ) Notice: Subject to any disclaimer, the term of this patent is extended or adjusted under 35 U.S.C. 154(b) by 0 days.

(21) Appl. No.: 11/291,079

(22) Filed: Nov. 29, 2005

(65) Prior Publication Data
US 2006/0138445 A1 Jun. 29, 2006

Related U.S. Application Data

(60) Provisional application No. 60/631,727, filed on Nov. 29, 2004.

(51) Int. Cl.
*H01L 27/15* (2006.01)
(52) U.S. Cl. .............. 257/79; 257/94; 257/95; 257/99; 257/745; 257/E33.001; 257/E33.062; 257/E33.065
(58) Field of Classification Search .......... 257/678, 257/81, 91, 99, 79, 94, 95, 745, E33.001, 257/62, 65
See application file for complete search history.

(56) References Cited

U.S. PATENT DOCUMENTS

| | | | |
|---|---|---|---|
| 4,864,370 A | 9/1989 | Gaw et al. | |
| 5,309,001 A | 5/1994 | Watanabe et al. | |
| 5,563,422 A | 10/1996 | Nakamura et al. | |
| 5,620,557 A | 4/1997 | Manabe et al. | |
| 5,656,832 A | 8/1997 | Ohba et al. | |
| 5,670,798 A * | 9/1997 | Schetzina | 257/96 |
| 5,698,865 A | 12/1997 | Gerner et al. | |
| 5,834,331 A | 11/1998 | Razeghi | |
| 5,900,650 A | 5/1999 | Nitta | |
| 6,118,801 A | 9/2000 | Ishikawa et al. | |
| 6,153,894 A | 11/2000 | Udagawa | |
| 6,307,218 B1 * | 10/2001 | Steigerwald et al. | 257/99 |
| 6,445,007 B1 * | 9/2002 | Wu et al. | 257/80 |
| 6,603,152 B2 * | 8/2003 | Song et al. | 257/99 |
| 6,610,995 B2 | 8/2003 | Nakamura et al. | |
| 6,614,056 B1 | 9/2003 | Tarsa et al. | |
| 6,650,018 B1 * | 11/2003 | Zhao et al. | 257/775 |
| 6,734,091 B2 | 5/2004 | Oh et al. | |
| 6,791,103 B2 | 9/2004 | Nakamura et al. | |
| 6,812,483 B2 | 11/2004 | Ohno et al. | |
| 6,858,873 B2 * | 2/2005 | Lee | 257/81 |
| 6,878,962 B1 | 4/2005 | Kawasaki et al. | |

(Continued)

OTHER PUBLICATIONS

Detchprohm et al., Hydride vapor phase epitaxial growth of a high quality GaN film using a ZnO buffer layer, Appl. Phys. Lett. 61 (22), Nov. 30, 1992, pp. 2688-2690.*

*Primary Examiner*—Wael Fahmy
*Assistant Examiner*—Minchul Yang
(74) *Attorney, Agent, or Firm*—Klein, O'Neill & Singh, LLP (57) ABSTRACT

Light emitting diodes (LEDs) with various electrode structures which preferably provide increased performance. In some embodiments the LEDs are GaN-based and in some embodiments the LEDs are ZnO-based, with a sapphire substrate or a ZnO substrate. In some embodiments the LEDs are hybrid GaN-based ZnO based LEDs.

25 Claims, 10 Drawing Sheets

U.S. PATENT DOCUMENTS

| | | |
|---|---|---|
| 2003/0107053 A1 * | 6/2003 | Uemura et al. .............. 257/200 |
| 2004/0000670 A1 | 1/2004 | Oh et al. |
| 2004/0000672 A1 | 1/2004 | Fan et al. |
| 2004/0077135 A1 | 4/2004 | Fan et al. |

* cited by examiner

GAN-BASED AND ZNO-BASED LED

CROSS-REFERENCE TO RELATED APPLICATION(S)

This application claims the benefit of U.S. Provisional Application No. 60/631,727, filed Nov. 29, 2004, the disclosure of which is incorporated by reference.

BACKGROUND

Blue/green/UV high brightness light emitting diodes (LEDs) are the next generation of solid state LED emitters. They are penetrating into a broad range of applications such as traffic signaling, medical uses, outdoor full motion LED video signage, and stage and building lighting. A combination of blue or UV LEDs and phosphors produces white LEDs, which will take on a whole new meaning for many far reaching applications such as: general illumination, outdoor signal, automobile lighting with built in safety features, and many more. The public has realized the benefits that can be obtained with solid state blue/green/UV/white LEDs and to-date, a large volume of research on GaN based, ZnO based and related materials has been conducted. GaN-based LEDs are manufactured with mass production in the US, Europe, and several Asian countries.

Often an LED includes a P-doped semiconductor layer approximate an N-doped semiconductor layer, often with quantum wells which can be considered between the P-doped layer and the N-doped layer. Injecting current into the device, such that the P-N junction is forward-biased, causes the device to emit light.

Figure 5:
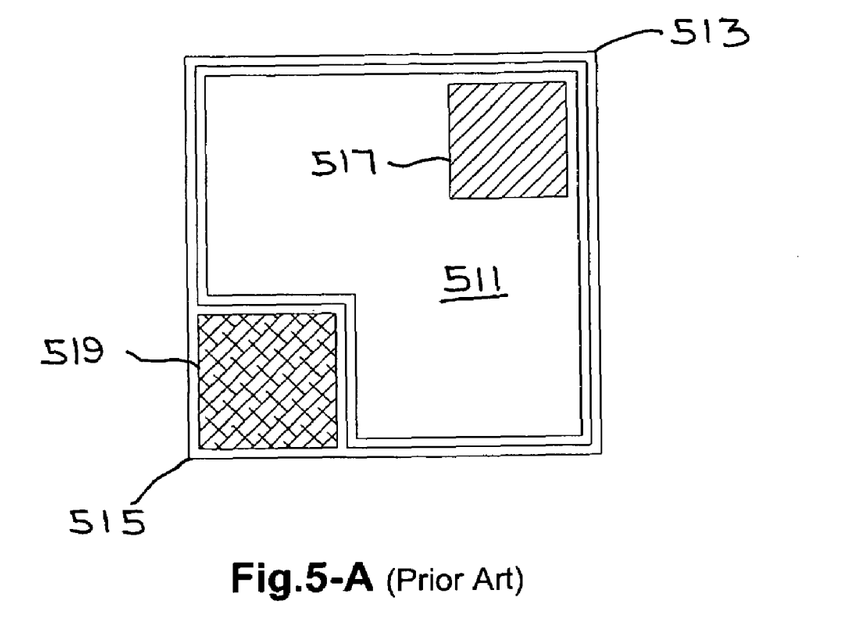
FIGS. 5A-B are top views of LEDs with dot-like electrodes.

FIGS. 5A and 5B are top views of typical GaN-based LED structures with a pair of P and N electrodes that are circular, square or rectangular and located at diagonally opposite corners of the LED chip. The electrodes are generally metal alloys with various thicknesses suitable for wire bonding connections to the device. As illustrated, FIG. 5A includes square contacts 517, 519 and FIG. 5B includes circular, or dot, electrodes 531, 533. Assuming in FIGS. 5A and 5B that the P-doped material is over the N-doped material, the P-doped material forms a mesa 511, with a portion of the top of N-doped material exposed about one corner 515 of the LED, which may be accomplished by way of etching or the like. The N electrode is on the exposed portion of the N-doped material. The P electrode is approximate an opposing corner of the LED, and is on the P-doped material or a current spreading layer deposited on top of the P-doped material, or a combination of the two.

Figure 6:
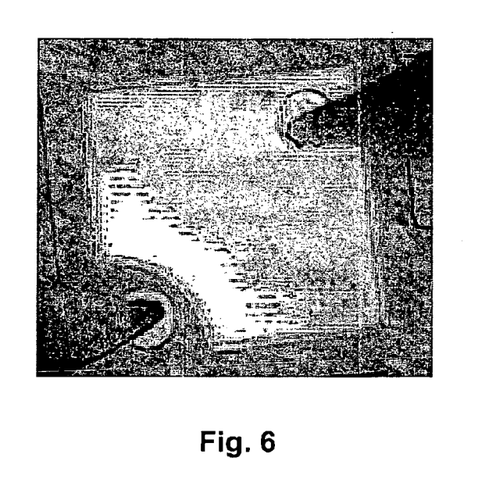
FIG. 6 is an illustration showing current crowding in an LED with dot-like electrodes.

These electrodes may be considered dot-like current electrodes, or simply dot-like electrodes. The primary difficulty of dot-like electrodes is current crowding, which tends to occur near the electrical contact of the LED chip because of the tendency of charge carriers to travel through a path of least resistance. As a result, current does not spread evenly over the entire structure of the LED chip, but segregates near the contact electrode. FIG. 6 shows a picture of current crowding near N electrode area of a GaN blue LED chip at an injection current of 20 mA. The current crowding problem can be partially remedied by increasing the thickness of a current spreading layer. However, the thicker the current spreading layer, the more light is absorbed. The current crowding effect can also be reduced by increasing the thickness of the N-type layer. As a drawback, the thicker the N-type layer, the greater the possibility of increasing defects in the crystal film, which could lower the quality and performance of the LED.

SUMMARY OF THE INVENTION

In one aspect the invention provides a light emitting diode element comprising: a substrate, a first semiconductor layer of a first doping substantially over the substrate, and a second semiconductor layer of a second doping substantially over a portion of the first semiconductor layer; a first electrode coupled to a portion of a top of the first semiconductor layer, the first electrode having a body approximate a corner of the first semiconductor layer and wings extending from the body; and a second electrode coupled to a portion of a top of the second semiconductor layer, the second electrode having a body approximate a corner of the second semiconductor layer and wings extending from the body.

In another aspect the invention provides a light emitting diode chip having a substrate, a first dopant layer, a single or multiple quantum well stack layer and a second dopant layer, the second dopant layer with the quantum well stack and a portion of the first dopant layers forming a mesa on the first dopant layer, with a first electrode on the first dopant layer, a second electrode on the second dopant layer and current spreading layer, the first electrode being about a first corner of the chip and the second electrode being about an opposing corner of the chip, with the first electrode having an inner edge facing towards a center of the chip and an outer edge facing away from the chip, the first electrode having elongated side portions, each side portion configured to extend proximate to a corresponding edge of the first corner; and the second electrode having an inner edge facing towards a center of the chip and an outer edge facing away from the chip, the second electrode having elongated side portions, each side portion configured to extend proximate to a corresponding edge of the second corner.

These and other aspects of the invention are more fully comprehended upon review of this disclosure, including the figures forming a part thereof.

DETAILED DESCRIPTION

Methods, structures, and contact electrode geometries for GaN-based and ZnO-based LED elements and chips are discussed herein.

In various embodiments ZnO-based materials include one, some, or all of Zn, MgO, BeO, CdO, ZnCdO, ZnMgO, ZnBeO, ZnBeMgO, ZnSeO, ZnSO, ZnSe, and ZnS compounds, and in various embodiments GaN based materials include one, some, or all of GaN, AlN, InN, InGaN, AlGaN, and InAlGaN compounds.

Figure 1:
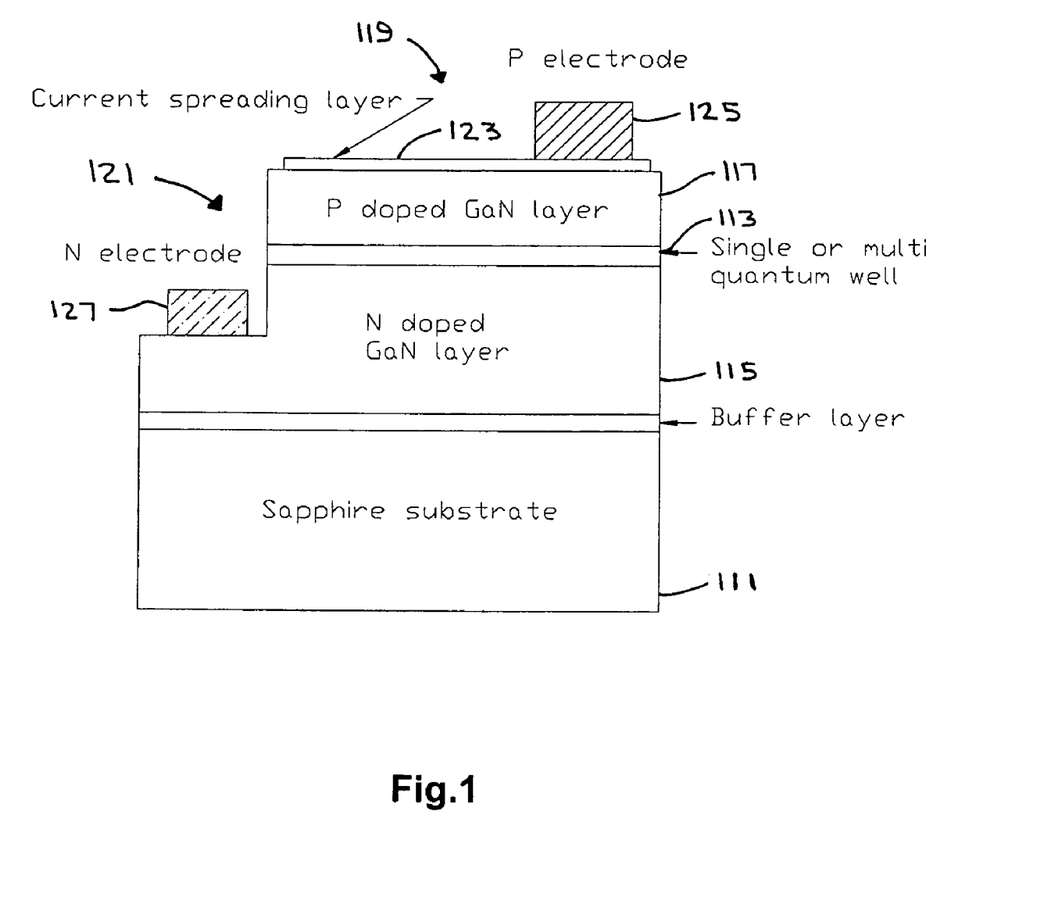
FIG. 1 is a sectional view of a GaN LED.

A sectional view of a GaN-based LED with a sapphire substrate is shown in FIG. 1. The GaN-based LED, as with most common semiconductor GaN/InGaN devices, has a sapphire substrate 111 and a light-emitting quantum well (QW) stack layer 113 which is sandwiched between an N-type doped semiconductor layer 115 and a P-type doped semiconductor layer 117. Because the sapphire substrate is an electrically insulating material, both the P-contact and N-contact electrodes are normally fabricated on a top side 119 of the LED wafer. In LED chip fabrication, a portion of the topside of the LED epitaxial structure is generally etched to expose the N-type doped semiconductor layer, resulting in a mesa structure 121 with the P-type doped semiconductor layer on the top. A current spreading layer 123 is deposited on top or a portion of the P-type doped layer. P-contact electrodes 125 are deposited on a portion of top of the current spreading layer. N-contact electrodes 127 are deposited onto the exposed N-type doped layers after the layer is etched.

Figure 2:
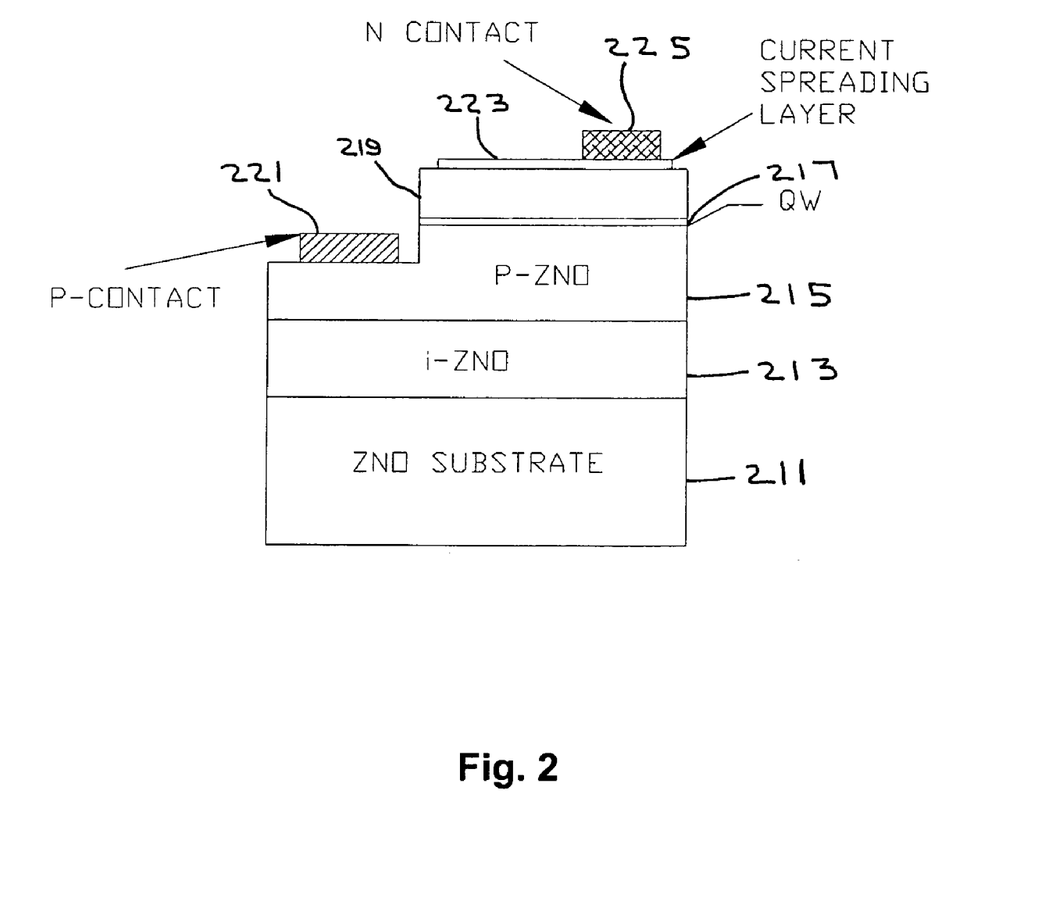
FIG. 2 is a sectional view of a ZnO LED.

FIG. 2 is a cross sectional view of a ZnO LED with an i-ZnO isolated layer structure. A ZnO LED structure is grown, in some embodiments, on a ZnO substrate. Since the ZnO substrate is electrically conductive, an LED structure with the N and P contact electrodes on both sides of the LED chip can be applied. However, a high quality P-typed ZnO layer is relatively more difficult to grow on the ZnO substrate or N-typed ZnO layer (with QW) than on an i-ZnO layer. Accordingly, in some embodiments, the LED epitaxial structure includes an i-ZnO layer on top of the substrate. Since i-ZnO is not highly conductive, both the P and N contacts are fabricated on the same side of the device, in most embodiments, just like the GaN-based LED with the sapphire substrate.

Accordingly, in the structure of FIG. 2, an i-ZnO layer 213 is grown onto a ZnO substrate 211, followed by a P-doped layer 215, single or multiple quantum well active layer 217, and an N-doped layer 219. A P contact electrode 221 of the device is deposited onto the P-doped ZnO area after the epitaxial layer is etched, for example by a wet etching or by a dry etching method. Light is emitted from the N electrode side of the wafer, which has a current spreading layer 223 on top of the mesa and an N contact electrode 225 at least partially on top of the current spreading layer. The P and N contact electrodes are conductive pads with various thicknesses utilized for current injection and wire bonding.

Figure 3:
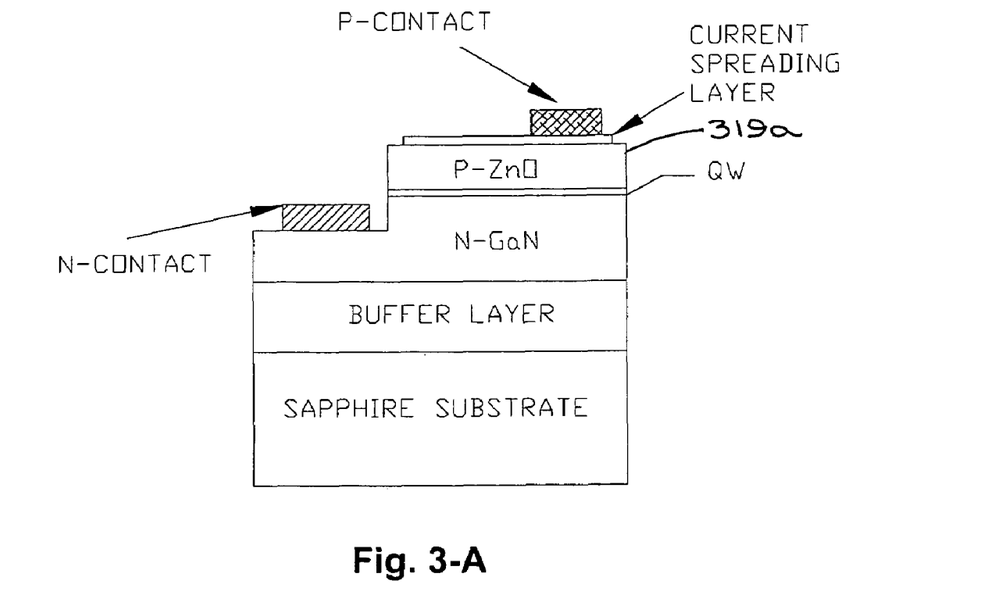
FIGS. 3A-B are sectional views of hybrid GaN—ZnO LEDs.

FIG. 3 illustrates cross-sectional views of embodiments of hybrid GaN/ZnO LED structures. In the embodiments of FIG. 3, a ZnO epitaxial layer 319a,b replaces a GaN layer of the device of FIG. 1, and similar process steps as in GaN LED fabrication are applied in constructing the devices of FIG. 3. FIGS. 3-A and -B show that the P-layer and N-layer are replaced, respectively, with ZnO layers. Another related structure is N-side-up hybrid GaN/ZnO LED devices on a sapphire substrate, in which the N doped layer is at the top of the epitaxial wafer while the P doped semiconductor layer is below the QW. The P-type doped layer is exposed at a lower surface than the N-type doped layer. The lower surface is defined by a mesa etch process, forming a mesa edge that separates the N-electrode from the P electrode.

Figure 4:
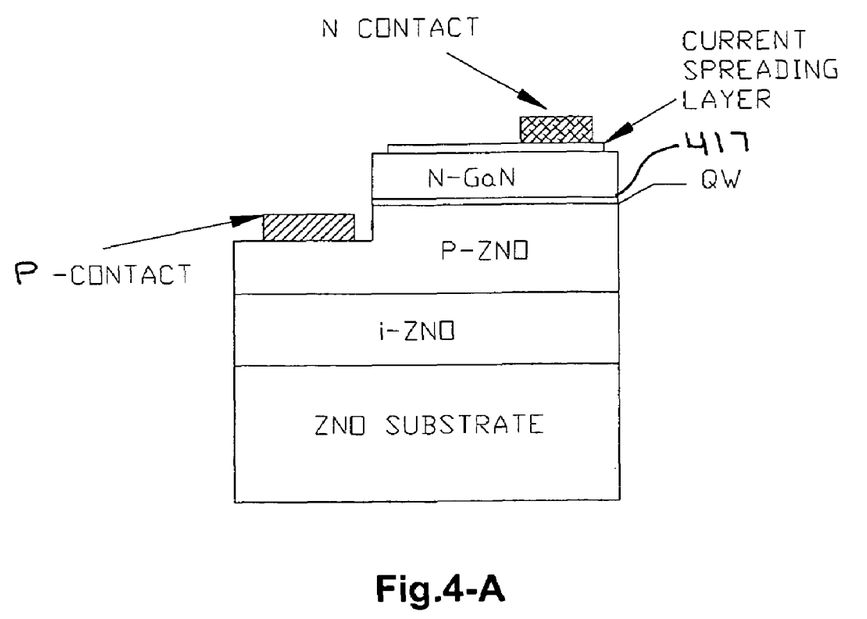
FIGS. 4A-B are sectional views of further hybrid GaN—ZnO LEDs.

FIG. 4 illustrates cross-sectional views of further embodiments of hybrid GaN/ZnO LED structures. A ZnO layer in the ZnO LED structure (FIG. 2) is replaced with a GaN epitaxial layer (N-layer 417 in FIG. 4-A and P-layer 419 in FIG. 4-B). Similar process steps are applied as in ZnO LED fabrication. Another related structure is P-side-up hybrid GaN/ZnO LED devices on ZnO substrate, in which the P doped layer is at the top of the epitaxial wafer and N-type doped semiconductor layer lies below the QW. The N-type doped layer is exposed at a lower surface than the P-type doped layer. The lower surface is defined by a mesa etch process, forming a mesa edge that separates the N-electrode from the P-electrode.

GaN-based and ZnO-based semiconductor LEDs are electrically pumped, solid state light-emitting devices. When an injection current is applied through the P- and N-type electrodes, the current expands to the whole current-spreading layer, the P doped and N doped layers. The light output of the LED is generated from the resistive QW layers, where a forward bias voltage is applied.

For a GaN-based LED, the light-emitting epitaxial structure includes: a substrate, a buffer layer, a N-type doped semiconductor layer, single- or multi-quantum well stacks, and a P-type doped semiconductor layer. In many embodiments a thin current spreading layer is deposited or grown on the P-type doped layer. In some embodiments the thin current-spreading layer is a metal alloy or other conducting and semi-transparent layer (for example Ni/Au, NiO/Au, indium tin oxide (ITO), ZnO, or digital penetration ITO). Generally the thin current spreading layer is deposited on top of the P-type doped layer and covers the majority of the P-type doped layer. The P-electrode is partially deposited on top of the current spreading layer. The N-type doped layer is exposed at a lower surface than the P-electrode. The lower surface is defined by a mesa etch process, with a mesa edge that separates the N-electrode from the P-electrode and current spreading layer. The symmetric bird-like P and N-electrodes are located at the opposite corners, allowing light to emerge from the area between them.

For a ZnO-based LED, the light-emitting epitaxial structure in some embodiments includes: a substrate, an i-ZnO layer, a P-type doped semiconductor layer, single- or multi-quantum well stack, and an N-type doped semiconductor layer. A thin current-spreading metal alloy layer is deposited on the surface of the N-type doped layer. The N-electrode is partially deposited on top of the current spreading layer, allowing direct contact with both the N-type doped layer and the current spreading layer. The P-type doped layer at a lower surface is exposed by a mesa etching process. The P-electrode is deposited onto this exposed area. The mesa edge separates the P-electrode from the N-electrode. The geometry of contact electrodes affects the LED performance directly. In some embodiments, the N and P-electrodes are defined in such a manner that a pair of symmetric bird-like electrodes is located at the opposite corners, allowing lights to emit in the area between them.

Figure 7:
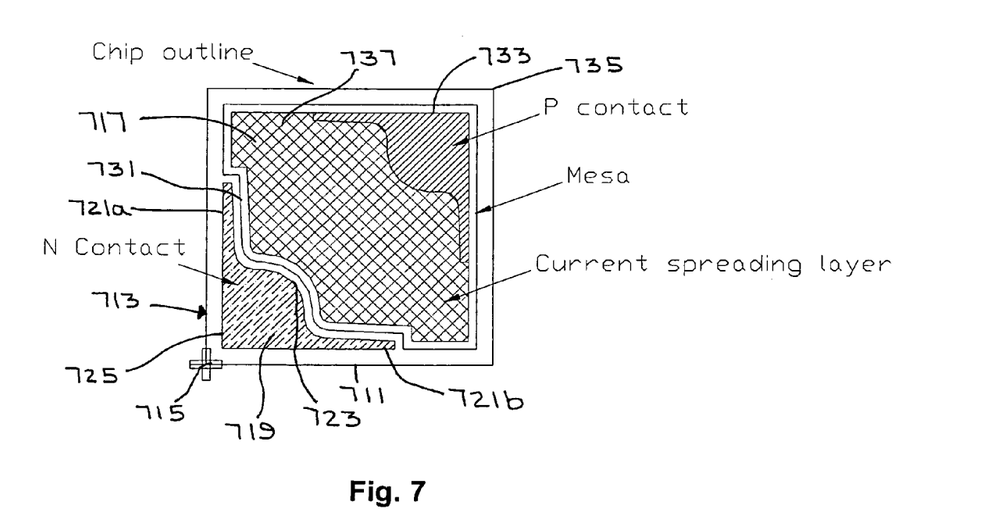
FIG. 7 is a top view of an LED with bird-like electrodes.

A GaN LED chip with bird-like contact electrode structure is shown in FIG. 7. We mostly discuss the structure of GaN related LED, however, in various embodiments the electrode structures are also suitable for ZnO-based LEDs, as well as hybrid LEDs containing both ZnO-based and GaN-based materials.

In some embodiments GaN-based and ZnO-based LEDs or hybrid GaN/ZnO LEDs are comprised of the following:
- A substrate (In various embodiments ZnO, GaN, sapphire, silicon, or other materials.)
- A semiconductor LED structure, generally grown on the substrate, along a vertical axis
- A current spreading layer, deposited on the semiconductor LED structure
- A P-electrode with a bird-like pattern with wings at the corner of the LED chip
- The two wings of the bird-like electrode extending along the edges, on top of a current-spreading layer in some embodiments
- A symmetrical N-electrode with a bird-like pattern at the opposite corner of the P bird-like electrode In some embodiments the electrode is in the form of a flying wing. In some embodiments the electrode includes tapered end portions. In some embodiments opposing electrodes include opposing saw-tooth shaped edges, with a distance between opposing electrodes variously increasing and decreasing across an edge of an electrode.

As illustrated in the top view of FIG. 7, the LED is formed of a chip, with the chip having a substantially square footprint in the illustrated embodiment. The LED has a two level upper surface, with a recessed surface 713 about one corner 715 of the chip and a mesa 717 rising above the recessed surface. Generally the recessed surface is formed by etching from a P-doped upper surface down to the N-doped layer (in embodiments with the P-doped layer over the N-doped layer). The recessed surface includes a body 719 about the corner of the chip, and two wings 721a,b extending from the body substantially perpendicular to each other about perpendicular edges of the chip forming the corner. The body substantially is in the form of a quarter circle of a circle centered at the one corner, and the body can be considered to have an inner edge 723 forming a convex curve. In some embodiments the body extends approximately one third the distance from the corner to the diagonal corners along the perpendicular edge, and in some embodiments extends approximately one quarter of the distance from the corner to the opposing corner. The wings extend towards diagonal corners of the chip and, as illustrated in FIG. 7, reach about two-thirds of the distance from the one corner to the diagonal corners. Also in the embodiment of FIG. 7, the wings form a substantially linear strip extending from the body.

An N-contact electrode 725 substantially covers the recessed surface. The N-contact electrode is generally a metallization deposited on the recessed surface, and substantially covers the recessed surface. The N-contact electrode has a shape as described above for the recessed surface, and indeed the surface of the recessed surface is largely the N-contact electrode.

The mesa largely forms the remainder of the upper surface of the LED, and the mesa rises above the recessed surface with a largely vertical wall 731 between the top of the mesa and the recessed surface. A P-contact electrode 733 is positioned about the opposite corner to the corner 735 about the recessed surface. Like the N-contact electrode, the P-contact electrode is generally a metal alloy deposited on the mesa. In the embodiment of FIG. 7 the P-contact electrode is a mirror image of the N-contact electrode, and accordingly the discussion of the shape of the N-contact electrode applies to the shape of the P-contact electrode, albeit with respect to the opposing corner of the LED chip. Accordingly, both the N-contact electrode and the P-contact electrode may be considered to have a bird like shape, with a body and wings, with the two birds flying in opposite directions.

A current spreading layer 737 largely covers the top of the mesa. In various embodiments the P-contact electrode is deposited partially over the current spreading layer, and generally the current spreading layer is deposited before the P-contact electrode.

The geometry of the LED electrodes generally provides for increased uniformity in current injection. The bird-like P-electrode improves the electric field distribution in the P-type doped semiconductor layer (and/or the current spreading layer for P-side-up LEDs), and the bird-like N-electrode improves the electric field distribution in the N-type doped semiconductor layer (and/or the current spreading layer for N-side-up LEDs). The combination of the bird-like P- and N-electrodes generally supports a more uniform current injection through the device than dot-like electrodes do. This combination reduces the series resistance and current crowding, and improves the device's overall efficiency.

Figure 8:
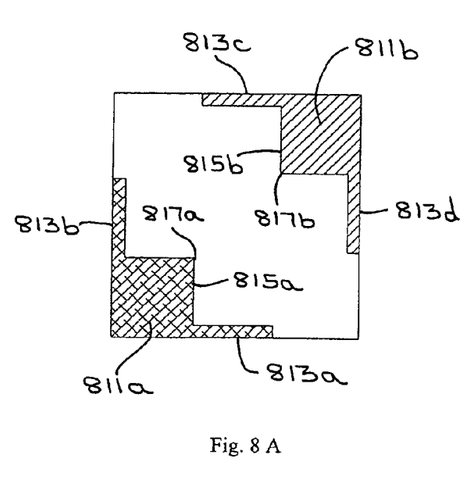
FIGS. 8A-G are simplified top views of LEDs with further bird-like electrodes.
Figure 9:
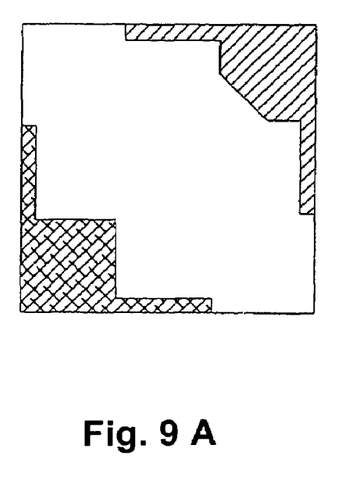
FIGS. 9A-F are simplified top views of further LEDs with combinations of bird-like electrodes.

FIGS. 8A-G show seven alternate embodiments with symmetric bird-like P and N-electrodes. They may be referred to as A type, B type . . . and G type LED electrodes. In the embodiment of FIG. 8A the electrodes each include a body 811a,b with two wings 813a-d extending from the body, as in the embodiment of FIG. 7. In FIG. 8A, however, the body is substantially rectangular, or square, in shape. Thus, instead of having an inner edge formed of a convex edge, the embodiment of FIG. 8A has an inner edge 815a,b including perpendicular linear segments, with a corner 817a,b of the electrode pointing towards the opposing corner of the LED.

The embodiment of FIG. 8B may be considered to have electrodes with a body of a diamond-like form. The body of each electrode includes three linear segments 821a-f on its inner edge, with one linear segment largely smoothing out what may be considered the corner of the electrode of the embodiment of FIG. 8A. The electrodes of the embodiment of FIG. 8C are similar to those of FIG. 8B in that the electrodes do not have as significant a portion of the body jutting out towards the opposing corner of the LED. In the embodiment of FIG. 8C the inner edge of the body is concave, forming a smooth curve 831a,b. Moreover, the smooth curve of the body transitions to a smooth curve of the wings, such that at least a portion of the wings may be considered to have a curved inner edge.

The embodiments of FIGS. 8D and 8E are similar to the embodiments of FIGS. 7 and 8A, respectively. In the embodiments of FIGS. 8D and 8E, however, the corner and the opposing corner of the LED, about which the electrodes are positioned, have radiused, or rounded, corners 841a,b and 851a,b. The embodiment of FIG. 8F is the same as the embodiment of FIG. 7, and is illustrated in the same format as FIGS. 8A-E and 8G so as to provide a point of comparison between the structure of FIG. 7 and the simplified views of the devices of FIGS. 8A-G, as well as the simplified views of FIGS. 9A-F.

The embodiment of FIG. 8G includes electrodes with substantially triangular shaped bodies 861a,b. Thus, each body has an inner edge 863a,b comprised of a single line segment.

Various embodiments include the combination of different bird-like electrodes from the above seven types. The combination of A type electrode with six other types of electrodes is shown in FIG. 9A-F, namely AB, AC, AD, AE, AF, and AG. There are a total of 42 (7×6) combinations with different electrodes.

Over all, the number of electrode combinations are 49 (7×7), including those with either the same or different type of electrodes. It is additionally noted, that the embodiment of FIG. 9B includes an electrode with a body having a concave inner edge comprising three linear segments, with the outer portions of the outer linear segments being considered as edges of the wings of the electrodes in some embodiments.

Accordingly, aspects of the invention provide LED structures and electrode configurations. Although the invention has been described with respect to specific embodiments, it should be recognized that the invention includes the claims and their insubstantial variations supported by this disclosure.

What is claimed is:
1. A light emitting diode element comprising:
a substrate, a first dopant semiconductor layer, a second dopant semiconductor layer, and light emitting quantum well stack layer substantially between the first and the second dopant semiconductor layers;

with the second dopant semiconductor layer, the quantum well and a portion of the first dopant semi conductor layer defining a mesa;

a first electrode coupled to an exposed top surface of the first dopant semiconductor layer, and the first electrode having a body approximate a corner of the exposed top surface of the first dopant semiconductor layer and wings extending from the body, each wing of the first electrode extending approximate a corresponding edge of the corner of the exposed top surface; and a second electrode coupled to a top of the mesa, the second electrode having a body approximate a corner of the top of the mesa and wings extending from the body, each wing of the second electrode extending approximate a corresponding edge of the corner of the top of the mesa, with each wing reaching about two thirds of a distance of a length of the corresponding edge;

the body of the first electrode extending from the corner of the exposed top surface of the first dopant semiconductor layer towards the corner of the top of the mesa with the second electrode about one quarter of the distance from the corner of the exposed top surface with the first electrode to the corner of the top of the mesa with the second electrode, and the body of the second electrode extending from the corner of the top of the mesa towards the corner of the exposed top surface with the first electrode about one quarter of the distance from the corner of the top of the mesa with the second electrode to the corner of the exposed top surface with the first electrode.

2. The light emitting diode element of claim 1, further comprising current spreading layer on at least a portion of the top of the mesa.

3. The light emitting diode of claim 2, wherein the current spreading layer at least partially couples the second electrode to the top of the mesa.

4. The light emitting diode element of claim 3, wherein the wings of the second electrode include a first wing and a second wing, and the first wing extends approximate a first edge of the mesa and the second wing extends approximate a second edge of the mesa.

5. The light emitting diode element of claim 1, wherein the wings of the first electrode include a first wing and a second wing, and the first wing extends approximate a first edge of the exposed top surface of the first dopant semiconductor layer and the second wing extends approximate a second edge of the exposed top surface of the first dopant semiconductor layer.

6. The light emitting diode element of claim 1,
wherein the wings of the second electrode include a first wing and a second wing, and the first wing extends approximate a first edge of the mesa and the second wing extends approximate a second edge of the mesa;
wherein the wings of the first electrode include a first wing and a second wing, and the first wing extends approximate a first edge of the exposed top surface of the first dopant semiconductor layer and the second wing extends approximate a second edge of the exposed top surface of the first dopant semiconductor contact layer.

7. The light emitting diode element of claim 6, wherein the corner of the exposed top surface with the first electrode and the corner of the top of the mesa with the second electrode are opposing corners.

8. The light emitting diode element of claim 7, wherein the body of the second electrode has a first outer edge approximate the first edge of the mesa, a second outer edge approximate the second edge of the mesa, and at least one inner edge towards the corner of the exposed top surface with the first electrode.

9. The light emitting diode element of claim 7, wherein the body of the first electrode has a first outer edge approximate the first edge of the exposed top surface of the first dopant semiconductor layer, a second outer edge approximate the second edge of the exposed top surface of the first dopant semiconductor layer, and at least one inner edge towards the corner of the top of the mesa with the second electrode.

10. The light emitting diode element of claim 8, wherein the inner edge is convex.

11. The light emitting diode element of claim 9, wherein the inner edge is convex.

12. The light emitting diode element of claim 1, wherein the first dopant semiconductor layer comprises one of a ZnO based or a GaN based material.

13. The light emitting diode element of claim 1, wherein the second dopant semiconductor layer comprises one of a ZnO based or GaN based material.

14. The light emitting diode element of claim 1, wherein one of the first dopant semiconductor layer and the second dopant semiconductor layer comprises a ZnO based material, and the other of the first dopant semiconductor layer and the second dopant semiconductor layer comprises a GaN based material.

15. A light emitting diode formed of a chip, the light emitting diode having a first contact on first dopant layer, a second contact on a second dopant layer and a mesa pattern;

the second dopant layer, a quantum well and a portion of the first dopant layer forming the mesa pattern on the first dopant layer and a substrate, the first contact being about a first corner of the chip and the second contact being about an opposing second corner of the chip, with the first contact having an inner edge facing towards a center of the chip and an outer edge facing away from the chip, the first contact having elongated side portions, each side portion configured to extend proximate to a corresponding edge of the first corner and reach a distance of about two thirds a length of the corresponding edge; and the second contact having an inner edge facing towards a center of the chip and an outer edge facing away from the chip, the second contact having elongated side portion, each side portion configured to extend proximate to a corresponding edge of the second corner;

wherein the first contact substantially extends along the corresponding edges of the first corner and extend from the first corner towards the second corner about one quarter of the distance between the first corner and the second corner of the chip, and wherein the second contact substantially extends along the corresponding edge of the second corner and extends from the second corner towards the first corner about one quarter of the distance between the first corner and the second corner of the chip.

16. The light emitting diode chip of claim 15, wherein the inner edge of any one of the first contact and the second contact comprises a single curved segment.

17. The light emitting diode chip of claim 15, wherein the inner edge of any one of the first contact and the second contact comprises a plurality of connected curved segments.

18. The light emitting diode chip of claim 15, wherein the inner edge of any one of the first contact and the second contact comprises a single linear segment.

19. The light emitting diode chip of claim 15, wherein the inner edge of any one of the first contact and the second contact comprises a plurality of connected linear segments.

20. The light emitting diode chip of claim 15, wherein the inner edge of any one of the first contact and the second contact comprises at least a pair of connected and substantially perpendicular linear segments.

21. The light emitting diode chip of claim 15, wherein the inner edge of any one of the first contact and the second contact is symmetric about a diagonal of the chip defined by the first corner and the second corner.

22. The light emitting diode chip of claim 15, wherein the outer edge of any one of the first contact and the second contact comprises a single curved segment.

23. The light emitting diode chip of claim 15, wherein the outer edge of any one of the first contact and the second contact comprises at least a pair of connected linear segments.

24. The light emitting diode chip of claim 15, wherein the outer edge of any one of the first contact and the second contact comprises at least a pair of connected and perpendicular linear segments.

25. The light emitting diode chip of claim 15, wherein the first contact comprises a thin metal alloy deposited on an etched portion of the first dopant layer.

* * * * *